United States Patent

Cepa et al.

Patent Number: 5,847,937
Date of Patent: Dec. 8, 1998

[54] METHOD FOR CONTACTING HIGH-CURRENT CONNECTING ELEMENTS OF AN ELECTRICAL COMPONENT, AND ASSEMBLY MADE BY SUCH A METHOD

[75] Inventors: Frank Cepa, Evora, Portugal; Erich Vojta, Hemhofen, Germany

[73] Assignee: Siemens Aktiengesellschaft, Munich, Germany

[21] Appl. No.: 809,005

[22] PCT Filed: Sep. 5, 1995

[86] PCT No.: PCT/DE95/01203

§ 371 Date: Mar. 10, 1997

§ 102(e) Date: Mar. 10, 1997

[87] PCT Pub. No.: WO96/08023

PCT Pub. Date: Mar. 14, 1996

[30] Foreign Application Priority Data

Sep. 9, 1994 [DE] Germany ............... 44 32 191.0

[51] Int. Cl.⁶ .................................................. H05K 7/02
[52] U.S. Cl. ...................... 361/809; 29/839; 361/807; 439/76.2
[58] Field of Search ................. 29/832, 835, 837–839, 29/842–844, 872; 228/175, 180.21, 1.1, 2.1, 2.5, 3.1; 174/72 B, 68.2, 251, 262, 263, 267; 361/637, 640, 644, 648, 652, 669, 670, 673, 728, 760, 772, 773, 774, 775, 779, 807, 809, 819, 822, 823, 824, 833, 781, 836

[56] References Cited

U.S. PATENT DOCUMENTS 3,868,770 3/1975 Davis et al. .
5,023,752 6/1991 Detter et al. ............... 361/809
5,057,026 10/1991 Sawai et al. ............... 439/76.2
5,067,905 11/1991 Matsumoto et al. ............... 439/76.2
5,446,626 8/1995 Dittmann et al. ............... 439/43

FOREIGN PATENT DOCUMENTS

| 0 312 415 | 4/1989 | European Pat. Off. . |
| 89 12 914.8 | 2/1990 | Germany . |
| 40 15 311 | 11/1991 | Germany . |
| 43 23 827 | 12/1994 | Germany . |
| 5-13906 | 5/1993 | Japan . |
| 2 029 107 | 3/1980 | United Kingdom . |
| 2 239 827 | 7/1991 | United Kingdom . |

*Primary Examiner*—Donald Sparks
*Attorney, Agent, or Firm*—Hill & Simpson

[57] ABSTRACT

In order to make contact from heavy-current connecting elements of a component, in particular a relay, to connecting conductors of an insulating mount (1), the blade terminals of the component, in the form of connecting tongues (10) are welded to bent connecting tabs (12) of the connecting conductors (13), which are embedded in a mount, for example a printed circuit board. In order to protect the plastic located in the vicinity against damage from the welding energy, the end sections of the connecting tabs (12) and of the connecting tongues (10) are provided with a tooth contour, such that the individual teeth (16, 17) are welded successively. Having a reduced area with which to conduct the current, the teeth reach a high thermal load. In consequence, the teeth rapidly reach the melted phase, without the adjacent plastic being caused to melt via the heat conduction in the short welding time.

9 Claims, 3 Drawing Sheets

METHOD FOR CONTACTING HIGH-CURRENT CONNECTING ELEMENTS OF AN ELECTRICAL COMPONENT, AND ASSEMBLY MADE BY SUCH A METHOD

BACKGROUND OF THE INVENTION

The invention relates to a method for making contact from high-current connecting elements of an electrical component to connecting conductors of an insulating mount, the connecting conductors, which are formed from sheet metal, being embedded in the plastic of the mount and projecting with connecting tabs from the surface of the mount, and flat connecting tongues of the component, resting parallel on the connecting tabs, being welded to them. In addition, the invention relates to an electrical assembly produced using this method.

In automobile technology and in other fields, it is common to combine one or more relays together with other components, such as diodes and resistors, on a small printed circuit board to form an assembly, a so-called module, which is provided with blade terminals to facilitate easy replacement. If the components in such a module, in particular relays, have to switch heavy currents, the etched and printed conductor tracks of conventional printed circuit boards are not sufficient to carry such high currents. In an attempt to solve this problem, it is known to produce the connecting conductors in the form of stamped sheet metal grids and to embed these grids in a printed circuit board which is produced as a molding, for example by injection molding. The connections between the components and the connecting conductors can in this case be produced via connecting tabs which are bent outward from the plane in which they are embedded in the injection-molded printed circuit board on a connection side. These tabs project a few millimetres from the printed circuit board. Since soft-solder joints between these connecting tabs and the component connections are not feasible because of the high current load and because the flux which is required in this case and damages contacts, attempts have been made to produce the contact via welded joints. However, since there is frequently little space available, the projecting connecting tabs can be only very small, i.e., around 2 to 3 mm. This means that the welding must take place in the immediate vicinity of the mount plastic. If, on the other hand, for environmental protection and cost reasons, a temperature-resistant plastic is not used for the mount, the previous welding methods produce a severe thermal load not only at the welding point but, because of the high conductivity, a severe thermal load on the adjacent mount plastic as well. This heating leads to thermal damage in the plastic, to undesirable formation of coatings on the contacts and, under some circumstances, to explosion of the melt at the welding point, if the liquefied plastic reaches this point.

Accordingly, the object of the present invention is to provide a method for making welded contact with heavy-current connecting elements of an electrical component, as well as an assembly produced using this method, the joint sections of the connecting conductors of the assembly mount and the connecting tongues of the component are designed such that the welded joint can be produced in the immediate vicinity of the plastic mount in a satisfactory manner while avoiding excessive thermal loading of the adjacent plastic mount.

SUMMARY OF THE INVENTION

The aforementioned object is achieved according to the an embodiment invention by a method of the type mentioned initially, where, in addition a tooth contour having one or more teeth is formed on the connecting tabs and the connecting tongues by means of material apertures. The cross section of these teeth is dimensioned such that, although a predetermined amount of welding energy which acts for a specific time duration admittedly welds the teeth which lie on one another of the welding tabs and of the connecting tongues, the thermal conduction via the teeth to the mount does not melt the mount plastic.

The welding energy is applied expediently by laser welding, plasma welding or, preferably, by protected arc welding. In the case of arc welding, it is especially expedient for thermal dissipation to take place at the same time by means of two electrode jaws which make contact with the teeth to be welded. In addition, it may be expedient additionally to shield the mount plastic by a mask during the welding process. This mask has cutouts in each case in the region of the connecting tongues and tabs.

An assembly which can be produced using the method according to the invention has a mount made of plastic. Connecting conductors which are embedded in the mount and are formed from electrically highly conductive sheet metal, such as copper or a copper alloy. Connecting tabs on the connecting conductors project outward from a mount surface. At least one component which is mounted on the mount, in particular one or more relays, whose connecting elements, in the form of flat connecting tongues are welded to the connecting tabs, such that they rest flat on them. According to an embodiment of the invention, those end sections of the connecting tabs and of the connecting tongues respectively on one another have a tooth contour with one or more teeth. The respective teeth which rest on one another are welded together.

In a preferred embodiment, the mount formed as a printed circuit board in one or two mutually perpendicular planes composed of plastic. The connecting conductors are embedded into the mount and are formed of one or more stamped grids. The connecting tabs are bent from the connecting conductors at right angles to the printed circuit board plane and are passed outward to a connecting side. Plug-in openings are cut out in the printed circuit board. Directly alongside the connecting tabs, one or more components having blade terminals, e.g., relays, are arranged on a component side, which is opposite the connection side, of the printed circuit board. The blade terminals of the components being plugged through the plug-in openings and are respectively welded to the connecting tabs on the connection side.

Additional features and advantages of the present invention are described in, and will be apparent from, the detailed description of the preferred embodiments and from the drawings.

DETAILED DESCRIPTION OF THE PREFERRED EMBODIMENTS

Figure 1:
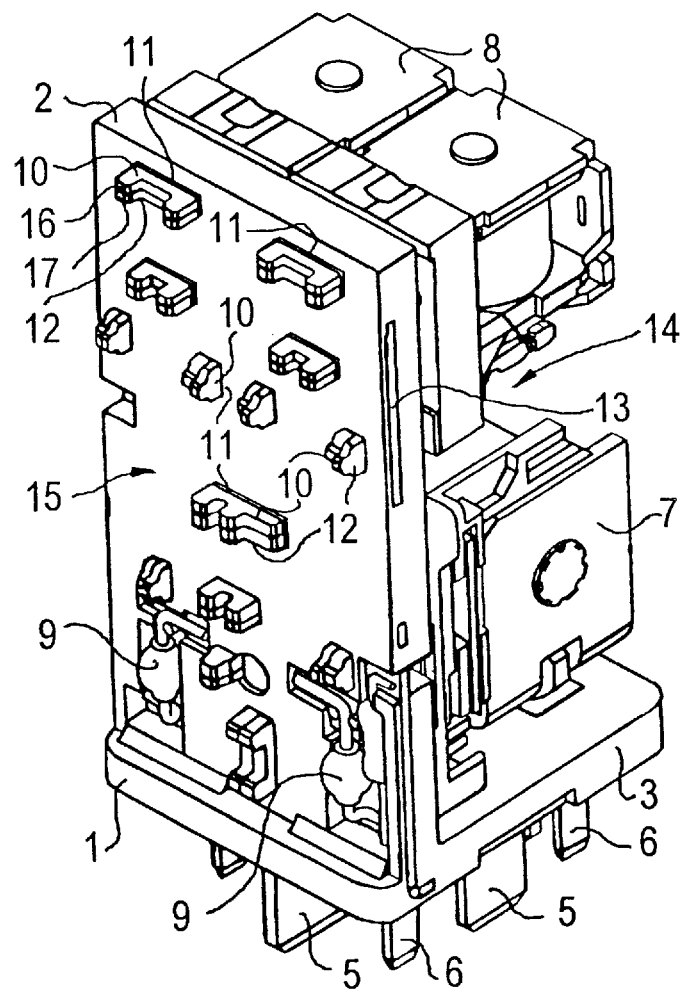
FIG. 1 is an isometric view of a relay module fitted with three different relays and having welded contacts according to an embodiment of the invention.

FIG. 1 shows an assembly, a so-called relay module, comprising a printed circuit board 1 which is injection-molded from plastic and has an L-shaped cross section. As illustrated, a vertical printed circuit board portion 2 serves for holding components, while a horizontal portion is used as a base which, together with a cap (not shown) forms a closed housing. (Of course, the "vertical" and "horizontal" terms relate only to the illustration of FIG. 1, and do not require such an actual orientation to operate in a given environment.) Plugs of different cross section emerge downwardly from the base. Specifically broad blade terminals 5 have a large cross section, and narrower blade terminals 6 having a smaller cross section.

In the illustrated example, the assembly includes three relays, namely a relatively large relay 7 as well as two relatively small relays 8. Additionally, the assembly can also include relatively small components 9, for example resistors or diodes. The relays 7 and 8 are inserted by means of blade terminals or connecting tongues 10 into plug-in openings 11 in the printed circuit board 1 and are welded on the rear side to connecting tabs 12 of connecting conductors 13. These connecting conductors, like conductor tracks, produce electrical connections between the connecting pins of the relays 7 and 8 and the other components 9, added to the blade terminals 5 and 6. In order to carry high currents, the connecting conductors are stamped from relatively thick sheet metal composed of a highly conductive metal, for example copper or a copper alloy. Moreover, the connecting conductors 13 are embedded in one or more planes—with angles and bends—in the printed circuit board 1. The sheet metal thickness of the connecting conductors is typically between 0.5 and 1.5 mm. The relays 7 and 8 are located in a component area 14 which is bounded by the limbs 2 and 3 of the printed circuit board 1 on the two sides, while the said connecting tabs 12 are bent outward from the extrusion coating at right angle to a connection side 15 of the printed circuit board limb 2, so that they project a short distance from the plastic, e.g., typically between 2 and 3 mm. The plug-in openings 11, which have also been mentioned, are located immediately alongside the bent connecting tabs 12, so that the connecting tongues 10 rest directly and parallel on the connecting tongues 12 after the relays 7 and 8 have been inserted.

As can also be seen from FIG. 1, the connecting tongues 10 of the relays and the connecting tabs 12 of the connecting conductors are respectively shaped in their end regions by means of appropriate cutouts to form a tooth contour. It is possible to form one, two or even more teeth 16 and 17 on the connecting tongues and the connecting tabs, in order to accomodate the required current load for the relevant connection. These teeth 16 and 17 respectively lie superimposed on one another and thus form individual weld points, whose conductor cross section is in each case considerably smaller than the total cross section of the connecting tabs and of the connecting tongues. As already stated, because of the thermal bottle neck produced by the cross section constriction, these teeth reach the melted phase considerably more quickly than in an embodiment having a solid material cross section, for a given welding current. At the same time, however, the heat is also dissipated via the smaller cross section considerably more slowly than the connecting tab itself and to the mount plastic of the printed circuit board 1, so that an excessive thermal load on the plastic can be avoided by suitably matching the tooth cross section and the duration for which the welding energy acts. If the lead cross section of a single tooth weld point is not sufficient for the planned current load on the relevant connection, a plurality of teeth and correspondingly a plurality of weld points can be provided in an appropriate manner which can then carry the required current overall. Since each tooth is welded individually, the thermal load of welding is thus distributed over a plurality of individual welds, so that the permissible thermal load for the plastic located in the vicinity is never exceeded, so long as the elements are designed appropriately.

Figure 2:
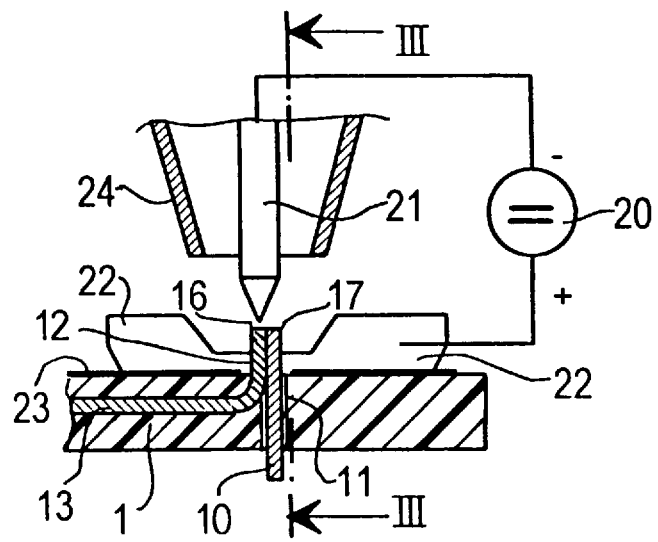
FIGS. 2 and 3 are sectional schematic views of an arrangement for making welded contact, the section of FIG. 2 being taken generally along line II—II of FIG. 3, and a section of FIG. 3 being taken generally along line III—III of FIG. 2, and FIGS. 4 to 6 are sectional views of various possible tooth designs for the joint sections which are provided for making contact.
Figure 3:
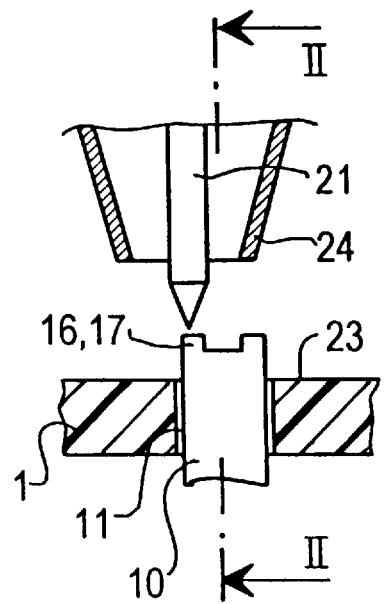

FIGS. 2 and 3 show, schematically, two views of a welding arrangement having a TIG welding device, as is preferably used for the invention. The connecting conductor 13 is embedded as a printed circuit board in the insulating mount of the printed circuit board 1. A connecting tab 12 is bent at right angles for a relay connection, so that it projects a few millimetres from the plastic. A plug-in opening 11 is cut out in the mount 1 alongside the connecting tab 12, through which opening a connecting tongue 10 of a relay is plugged. The end of the connecting tongue 10 rests parallel on the connecting tab 12. As can be seen from FIG. 13, the connecting tab 12 and the connecting tongue 10 each have two stamped-out teeth 16 and 17, respectively. For arc welding, an electrode 21 which is connected to the cathode of a welding current source 20, is arranged a short distance above a tooth pair 16 and 17, while the anode is connected to welding jaws 22 which press the connecting tab 12 and the connecting tongue 10 against one another during welding. These welding jaws 22 may be composed of a highly thermally conductive material and, in consequence, can additionally dissipate heat, as cooling elements. In addition, shielding plate 23, which has cutouts in the region of the connecting tabs and of the connecting lugs, can shield the surface of the plastic mount. The welding electrode 21 is additionally surrounded by a nozzle 24 through which protective gas, for example argon, is blown onto the weld point during welding.

Figure 4:
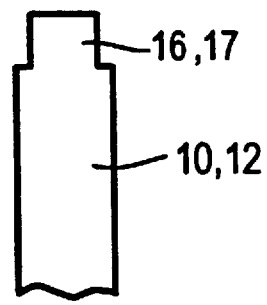
Figure 5:
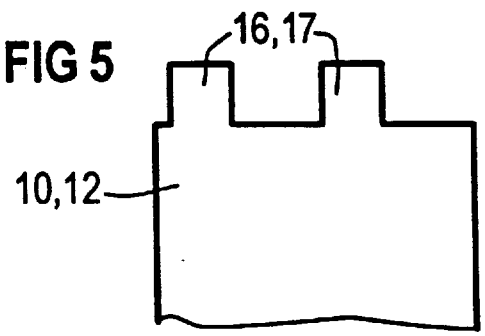
Figure 6:
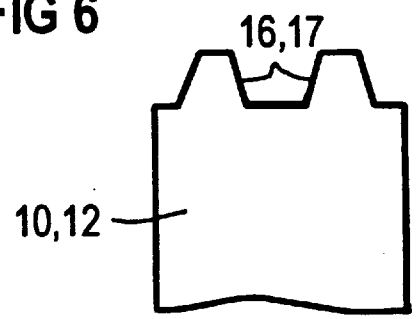

FIGS. 4 to 6 show a number of possible tooth contours as may be considered for the invention. Particularly, FIG. 4 shows a connecting tab 12 having a tooth 17 with a rectangular contour, and FIG. 5 shows a correspondingly broader connecting tab 12 having two teeth 17, also with a rectangular contour. FIG. 6 shows corresponding teeth 27 with a trapezoidal contour. Alternatively, triangular or any other desired contours are also conceivable. The important feature is only that the teeth are in each case welded during a predetermined, short welding duration of, for example, 100 ms and, at the same time, ensure the necessary electrical contact for the relevant component without the thermal conduction of the welding energy to the mount plastic causing the latter to melt. As mentioned, the overall conductor cross section for the connection is multiplied by the number of teeth, but only the welding energy load on the individual teeth applies in each case, offset in time.

Various changes and modifications to the presently preferred embodiments will be apparent to those skilled in the art. Such changes and modifications may be made without departing from the spirit and scope of the present invention and without diminishing its attendant advantages. Therefore, the foregoing description is illustrative, and not limiting. Moreover, the appended claims are intended to cover such changes and modifications.

What is claimed is:

1. A method for contacting high-current connecting elements of an electrical component to connecting conductors of a plastic insulating mount, the connecting conductors being formed from sheet metal and embedded in the mount, the method comprising the steps of:

providing a plurality of connecting tabs extending from the conductors and projecting through a surface of the mount;

providing a plurality of flat connecting tongues on the component which are respectively disposed against, and extend through the mount parallel to, the connecting tabs;

providing notches in respective connecting tabs and connecting tongues to form a cooperative tooth contour on the connecting tabs and the connecting tongues by means of material apertures;

welding the connecting tabs to the respectively contacted connecting tongues by applying welding energy to said teeth; and selecting a cross section of said teeth such that the welding step welds the teeth and the connecting tongues without melting the mount plastic.

2. The method as claimed in claim 1, wherein the welding step includes laser welding, plasma welding or protected arc welding.

3. The method as claimed in claim 2, wherein the welding step includes arc welding, the method further comprising dissipating heat during arc welding via electrode jaws (22) which make contact with the teeth (16, 17) to be welded.

4. The method as claimed in one of claim 1, further comprising shielding the mount plastic by a mask during the welding step, the mask having cutouts respectively located in the region of each of the connecting tongues and connecting tabs.

5. An assembly comprising:

a plastic mount;

a plurality of metal connecting conductors embedded in the mount;

a plurality of connecting tabs respectively extending from said conductors outwardly beyond a flush surface of said mount;

at least one component mounted on the mount;

a plurality of flat connecting tongues operably connected to the component and extending through the mount, each said connecting tongue lying against a respective one of said connecting tabs;

respective end sections of the connecting tabs and of the connecting tongues being cooperatively shaped to define a tooth contour comprising one or more teeth, the teeth which rest on one another being respectively welded together.

6. The assembly as claimed in claim 5, wherein the mount is a plastic printed circuit board into which the connecting conductors are embedded in the form of one or more stamped grids, wherein the connecting tabs are bent from the connecting conductors at right angles to a plane of the printed circuit board and pass outward to a connecting side, wherein plug-in openings located in the printed circuit board respectively alongside the connecting tabs, and wherein the component has a plurality blade terminals and is mounted on a component side of the printed circuit board opposite the connection side such that the blade terminals project through the plug-in openings to form said connecting tongues and are welded to the respective connecting tabs at said teeth on said connection side.

7. An assembly comprising:

an insulative mount having a plurality of metal connecting conductors embedded therein;

a plurality of connecting tabs bent from said connecting conductors and externally projecting from a connection side of said mount;

a component secured to said mount opposite said connection side;

a plurality of conductive connecting blades projecting from said component through said mount and outwardly from said connection side, each said connecting blade being respectively positioned adjacently against one of said connecting tabs, each adjacent connecting blade and connecting tab cooperatively forming an end contour having one or more teeth, said teeth being sized with a reduced cross-section such that each tooth is welded when applied with a predetermined welding energy and such that said teeth permit thermal conduction through said respective connecting blade and connecting tab at an amount less than required to melt said insulative mount.

8. An assembly according to claim 7, wherein mount is a printed circuit board.

9. An assembly according to claim 7, wherein said connecting conductors are formed by at least one stamped metal grid.

\* \* \* \* \*